United States Patent
Meng et al.

(10) Patent No.: US 9,410,233 B2
(45) Date of Patent: Aug. 9, 2016

(54) METHOD OF MANUFACTURING SEMICONDUCTOR DEVICE AND WAFER

(75) Inventors: Xiaoying Meng, Shanghai (CN); Junqing Zhou, Shanghai (CN); Haiyang Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 1101 days.

(21) Appl. No.: 13/243,944

(22) Filed: Sep. 23, 2011

(65) Prior Publication Data

US 2012/0273923 A1    Nov. 1, 2012

(30) Foreign Application Priority Data

Apr. 29, 2011   (CN) .......................... 2011 1 0109825

(51) Int. Cl.
    *H01L 29/02* (2006.01)
    *C23C 14/00* (2006.01)
    (Continued)

(52) U.S. Cl.
    CPC ......... *C23C 14/0036* (2013.01); *C23C 14/0005* (2013.01); *C23C 14/0641* (2013.01); *H01L 21/28114* (2013.01); *H01L 21/28123* (2013.01);
    (Continued)

(58) Field of Classification Search
    CPC .............. H01L 21/823807; H01L 21/823814; H01L 21/7624; H01L 29/7848; H01L 29/165; H01L 21/7787; H01L 21/76224
    USPC ................. 438/308, 296, 197, 142, 199, 424; 257/306, 377, 335
    See application file for complete search history.

(56) References Cited

U.S. PATENT DOCUMENTS 6,110,571 A * 8/2000 Yaginuma ................. C23C 8/38
                                                         428/216
7,923,313 B1    4/2011 Tutt et al.
(Continued)

FOREIGN PATENT DOCUMENTS

CN    1177829       4/1998
JP    2007073801    3/2007

OTHER PUBLICATIONS

Lee et al. "Implant Damage and Gate-Oxide Effects on Product Reliability" IEDM 04-481 19.3.1, (2004).*

(Continued)

*Primary Examiner* — Kenneth Parker
*Assistant Examiner* — Bo Fan
(74) *Attorney, Agent, or Firm* — Koppel, Patrick, Heybl & Philpott

(57) ABSTRACT

A method of manufacturing semiconductor device and a wafer are provided in accordance with embodiments of the present invention, which relates to semiconductor technology. The method includes: providing a substrate, and forming a gate oxide layer and a polysilicon layer on a first surface of the substrate; etching the polysilicon layer by use of a patterned mask so as to form a polysilicon gate with reentrants; depositing a tensile stress film on a second surface of the substrate before etching the polysilicon layer. The tensile stress film can be deposited on the second surface of the substrate for generating the tensile stress for the wafer. Thus, a polysilicon gate with reentrants can be formed in etching process. In this way, semiconductor devices can have smaller gate-source/drain overlap capacitance and better TDDB parameters, and the performance of the devices can be improved.

10 Claims, 11 Drawing Sheets

(51) Int. Cl.
*H01L 21/28* (2006.01)
*H01L 21/3213* (2006.01)
*H01L 29/423* (2006.01)
*C23C 14/06* (2006.01)

(52) U.S. Cl.
CPC .... *H01L 21/32135* (2013.01); *H01L 21/32137* (2013.01); *H01L 29/42376* (2013.01)

(56) References Cited

U.S. PATENT DOCUMENTS

| | | |
|---|---|---|
| 2004/0262688 A1 | 12/2004 | Nowak et al. |
| 2006/0118824 A1* | 6/2006 | Otsuka ............... H01L 29/7787 257/194 |
| 2007/0018205 A1* | 1/2007 | Chidambarrao H01L 21/823412 257/288 |
| 2007/0099369 A1* | 5/2007 | Ning ............... H01L 21/823807 438/199 |
| 2008/0050886 A1* | 2/2008 | Hirota ............... H01L 21/76224 438/424 |
| 2011/0070701 A1* | 3/2011 | Ning ............... H01L 21/823807 438/199 |

OTHER PUBLICATIONS

Chang et al. "Notch Formation by stress enhanced etching of Poilysilicon" J. Vac. Sci. Tech. B. 19(5) Sep. 2001.*
Kang et al. "Effects of Film Stress modulation using TiN" IEEE 0741-3106; Oct. 2008.*
"Implant Damage and Gate-Oxide-Edge Effects on Product Reliability", by Yung-Huei Lee, et al., IEDM 04-481, © 2004, IEEE, pp. 19.3.1-19.3.4.
"Effects of Film Stress Modulation Using TiN Metal Gate on Stress Engineering and Its Impact on Device Characteristics in Metal Gate/High-k Dielectric SOI FinFETs", by Chang Yong Kang, et al., IEEE Electron Device Letters, vol. 29, No. 5, May 2008, pp. 487-490.
"Notch formation by stress enhanced spontaneous etching of polysilicon", by Jane P. Chang, et al., J. Vac. Sci. Technol. B 19(5), Sep./Oct. 2001, pp. 1870-1873.
Office Action from corresponding Chinese Patent Office, Appl. No. 201110109825.3, issued Nov. 4, 2013.

* cited by examiner

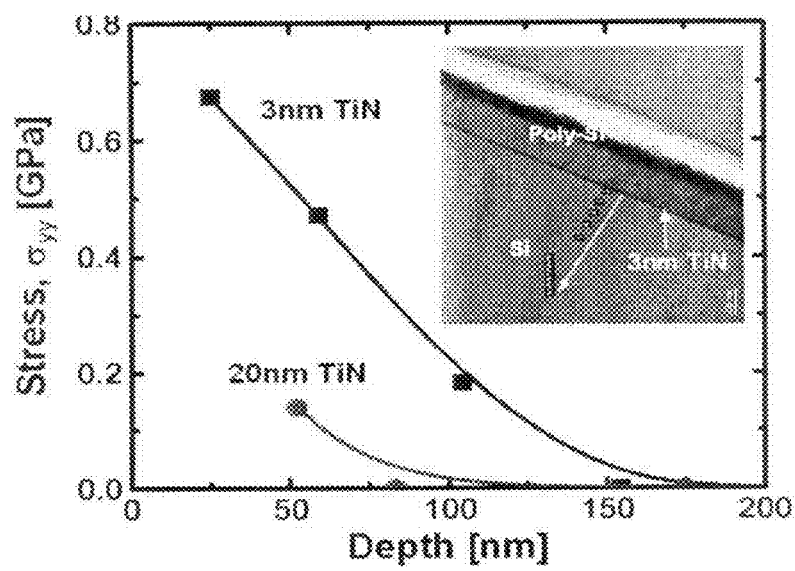
Fig. 6 - Prior Art

METHOD OF MANUFACTURING SEMICONDUCTOR DEVICE AND WAFER

CROSS-REFERENCE TO RELATED APPLICATIONS

This application claims priority to Chinese Patent Application No. 201110109825.3, filed on Apr. 29, 2011 and entitled "METHOD OF MANUFACTURING SEMICONDUCTOR DEVICE AND WAFER", which is incorporated herein by reference in its entirety.

BACKGROUND OF THE INVENTION

1. Field of the Invention

The present invention relates to semiconductor technology, and more particularly, to a method of manufacturing semiconductor device and a wafer.

2. Description of the Related Art

In modern semiconductor processes, the shape and implantation energy of a polysilicon gate have strong impact on gate oxide reliability.

FIG. 8 is a graph showing the variation in NMOST (N-channel Metal-Oxide-Semiconductor Field-effect transistor) gate source/drain overlap capacitance as a function of the shape of a polysilicon gate (see Yung-Huei Lee, et al, IEDM 04-481 19.3.1). In FIG. 8, curve a, b and c respectively indicate the variations in gate source/drain overlap capacitance of a gate with reentrants on the bottom, a gate with a straight wall on the bottom and a gate with foot on the bottom.

FIG. 9A-9B is a graph showing comparison of the NMOST TDDBs (Time-Dependent Dielectric Breakdown) as a function of the shape of a polysilicon gate. The curve a, b and c respectively indicate the shapes of the polysilicon gates which are respectively with reentrants on the bottom, a straight wall on the bottom and foot on the bottom (see Yung-Huei Lee, et al, IEDM 04-481 19.3.1). FIG. 9A is a graph showing the variation in NMOST TDDB of area structure (30×15 $\mu m^2$) as a function of the shape of a polysilicon gate. FIG. 9B is a graph showing the variation in NMOST TDDB of edge structure (2000 $\mu m \times 60$ nm) as a function of the shape of a polysilicon gate. Stresses are performed at different e-fields for the two structures. There is no significant difference in TDDB distribution of area structure between the three splits. However, for the edge structure, the mean time of failure (MTF) of the polysilicon gate with foot on the gate bottom shows about 2.5× reduction than the other two splits.

It can be observed by the above figures that the polysilicon gate with foot tends to cause more gate-to-LDD overlap, and brings larger device overlap capacitance; the polysilicon gate with foot allows high energy implant to penetrate through the edge of the gate oxide which may downgrade the reliability of the gate oxide, and cause polysilicon gate edge TDDB failure. In prior art, there is no process or method for controlling the producing of polysilicon gates with reentrants well.

SUMMARY OF THE INVENTION

This disclosure is proposed in view of the above problems.

An object of the present invention is to provide a method of manufacturing semiconductor device for forming a polysilicon gate with reentrants.

Another object of the present invention is to provide a wafer made for forming a polysilicon gate with reentrants.

According to a first aspect of the present invention, there is provided a method of manufacturing a semiconductor device. The method includes: providing a substrate, on a first surface of which a gate oxide layer and a polysilicon layer are formed; etching the polysilicon layer by use of a patterned mask so as to form a polysilicon gate with reentrants; wherein the method further comprises: depositing a tensile stress film on a second surface of the substrate before etching the polysilicon layer.

Preferably, the method further includes: removing the tensile stress film after forming the polysilicon gate.

Preferably, the tensile stress film is a nitride film with a tensile stress.

Preferably, the tensile stress film is a titanium nitride film, a phosphorus nitride film, or an aluminium nitride film.

Preferably, the tensile stress film has a thickness of 2-50 nm.

Preferably, the substrate is formed with the gate oxide layer, the polysilicon layer and a hard mask layer on the first surface thereof. Depositing a tensile stress film on a second surface of the substrate before etching the polysilicon layer includes: depositing the tensile stress film on the second surface of the substrate before forming the hard mask layer on the first surface of the substrate; or depositing the tensile stress film on the second surface of the substrate, after patterning the hard mask layer, and before etching the polysilicon layer with the patterned hard mask layer.

Preferably, the substrate is formed with the gate oxide layer, the polysilicon layer and a photoresist layer on the first surface thereof. Depositing a tensile stress film on a second surface of the substrate before etching the polysilicon layer includes: depositing the tensile stress film on the second surface of the substrate before forming the photoresist layer on the first surface of the substrate; or depositing the tensile stress film on the second surface of the substrate, after patterning the photoresist layer by means of photolithography to form a patterned photoresist layer and before etching the polysilicon layer masked by the patterned photoresist layer.

Preferably, the etching is a dry etching or a plasma etching.

According to the first aspect of the present invention, the tensile stress film can be deposited on the second surface of the substrate for generating the tensile stress for the wafer. Thus, a polysilicon gate with reentrants can be formed in etching process.

According to a second aspect of the present invention, there is provided a wafer for manufacturing semiconductor device. The wafer includes: a tensile stress film deposited on a surface of the wafer for producing a tensile stress on the wafer.

Preferably, the tensile stress film is a nitride film with tensile stress.

According to the second aspect of the present invention, a wafer with the tensile stress film on one of its surface is provided. The strain on the wafer caused by the tensile stress film is helpful to make a polysilicon gate with reentrants formed on the wafer.

BRIEF DESCRIPTION OF THE DRAWINGS

FIG. 3A illustrates a sectional view after forming a gate oxide layer and a polysilicon layer in succession on the first surface of the substrate; FIG. 3B illustrates a sectional view after depositing a TiN layer on the second surface of the substrate; FIG. 3C illustrates a sectional view after forming a photoresist pattern on the polysilicon layer; FIG. 3D illustrates a sectional view after forming a polysilicon gate with reentrants through etching the polysilicon layer using patterned photoresist as a mask; FIG. 3E illustrates a sectional view after removing the remained photoresist; FIG. 3F illustrates a sectional view after removing the TiN layer;

FIG. 5A illustrates a sectional view after forming a gate oxide layer, a polysilicon layer and a hard mask in succession on a first surface of the substrate; FIG. 5B illustrates a sectional view after forming a hard mask pattern; FIG. 5C illustrates a sectional view after depositing a TiN layer on a second surface of the substrate; FIG. 5D illustrates a sectional view after forming a polysilicon gate with reentrants through etching the polysilicon layer using the patterned hard mask as a mask; FIG. 5E illustrates a sectional view after removing the TiN layer; FIG. 5F illustrates a sectional view after removing the remained hard mask;

FIG. 6 is a graph showing the corresponding relation between the thinkness of a TiN liner and stress;

FIG. 7A illustrates situations of respectively applying a compressive stress (a) and a tensile stress (b) by a screw and tungsten wire; FIG. 7B illustrates the shapes of the polysilicon gates;

DESCRIPTION OF THE EMBODIMENTS

Figure 1:
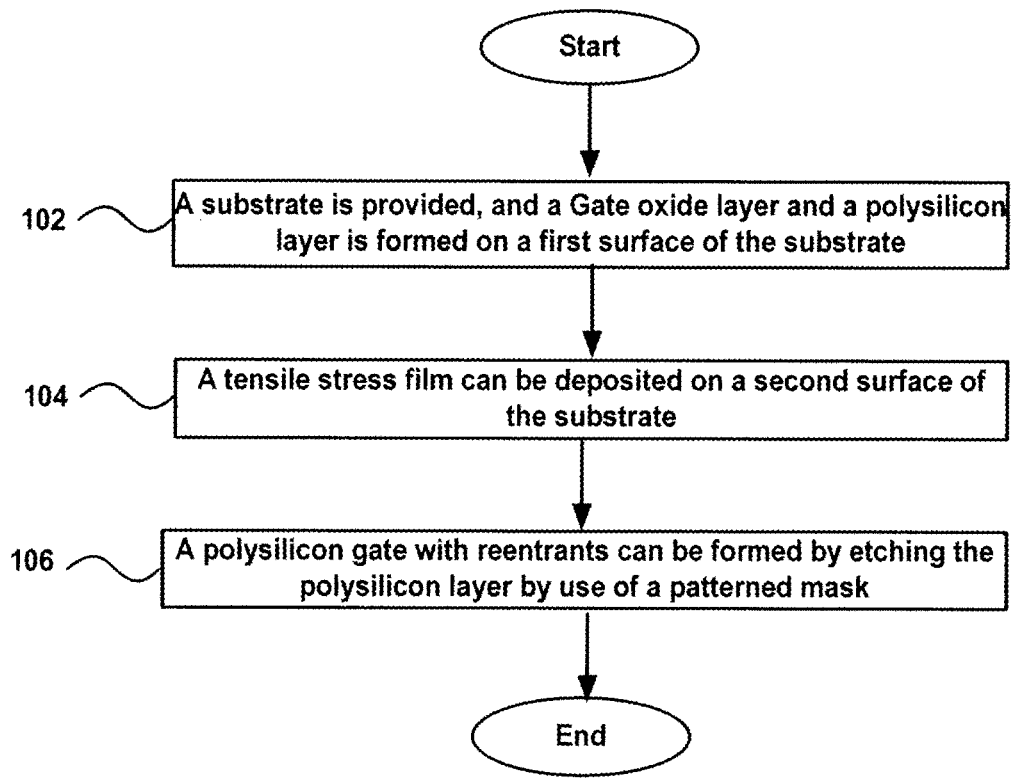
FIG. 1 is a flowchart schematically showing a method of manufacturing semiconductor device in accordance with a first embodiment of the present invention.

The present invention will be described more thoroughly with reference to accompanying drawings in which exemplary embodiments of the present invention are illustrated. In the drawings, same reference numerals designate same or like components or elements.

FIG. 1 is a flowchart showing a method of manufacturing semiconductor device in accordance with a first embodiment of the present invention.

As shown in FIG. 1, at step 102, a substrate is provided. A gate oxide layer and a polysilicon layer are formed on a first surface of the substrate.

At step 104, a tensile stress film can be deposited on a second surface of the substrate. The tensile stress film includes nitride films, such as, titanium nitride (TiN) film, phosphorus nitride film, aluminium nitride film etc. In one embodiment, the step of depositing TiN includes: at room temperature or high temperature, the target (Ti) can be sputtered by plasma such as Ar, nitrogen can be brought into a chamber for depositing TiN. The content of nitrogen and the thinkness of TiN can affect the stress of TiN. In one embodiment, the thinkness of the tensile stress film can be 2-50 nm.

At step 106, the polysilicon layer is etched by use of a patterned mask so as to form a polysilicon gate with reentrants. Either a dry etching or a plasma etching can be adopted.

It should be noted that, although FIG. 1 illustrates the step 104 being between the step 102 and the step 106, the embodiment shown in FIG. 1 doesn't mean to limit the sequence of the step 104. The object of the present invention can be achieved as long as the tensile stress film is deposited on the second surface of the substrate before etching the polysilicon. The sequence of the depositing the tensile stress film step in the process will be described next in various exemplary embodiments with reference to the drawings.

In the above embodiment, through depositing the tensile stress film on the second surface of the substrate, a tensile stress can be applied on the wafer, so as to produce a polysilicon gate with reentrants by etching the polysilicon layer. In this way, semiconductor devices can have smaller gate-source/drain overlap capacitance and better TDDB parameters, and the performance of the semiconductor devices can be improved.

Figure 2:
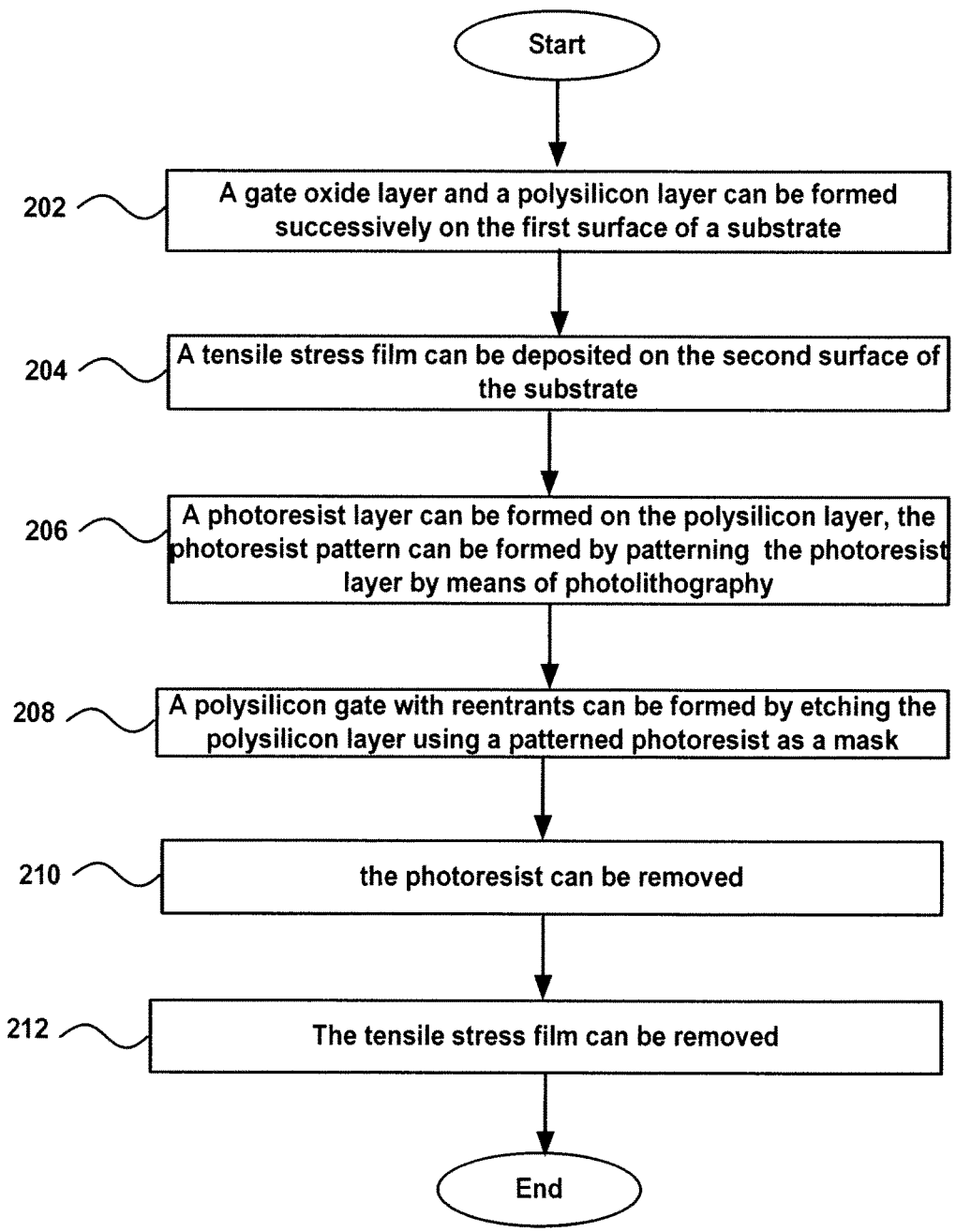
FIG. 2 is a flowchart schematically showing a method of manufacturing semiconductor device in accordance with a second embodiment of the present invention.

FIG. 2 is a flowchart showing a method of manufacturing semiconductor device in accordance with a second embodiment of the present invention.

As shown in FIG. 2, at step 202, a gate oxide layer and a polysilicon layer can be formed successively on a first surface of a substrate.

At step 204, a tensile stress film can be deposited on a second surface of the substrate. After depositing the tensile stress film, the tensile stress can be applied on the wafer.

At step 206, a photoresist layer can be formed on the polysilicon layer. The photoresist pattern can be formed by patterning the photoresist layer by means of photolithography.

At step 208, a polysilicon gate with reentrants can be formed by etching the polysilicon layer using a patterned photoresist as a mask. Under the tensile stress generated by the tensile stress film, the polysilicon gate with reentrants can be formed by etching the polysilicon layer. The dry etching process can be used.

At step 210, the remained photoresist can be removed.

At step 212, the tensile stress film can be removed.

Figure 3A:
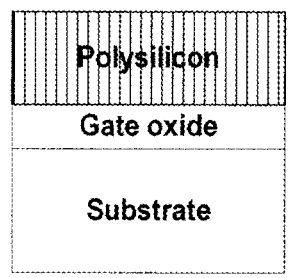
FIG. 3A-3F schematically illustrate sectional views of a semiconductor device of respective steps in the method of manufacturing semiconductor device in accordance with the second embodiment of the present invention.
Figure 3B:
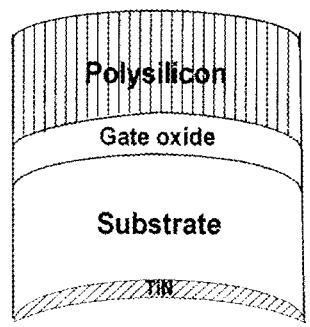
Figure 3C:
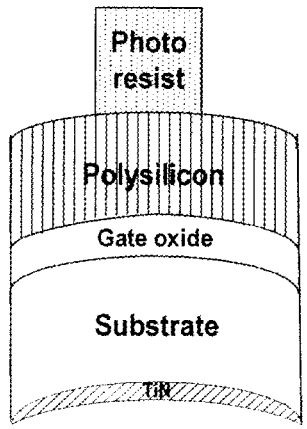
Figure 3D:
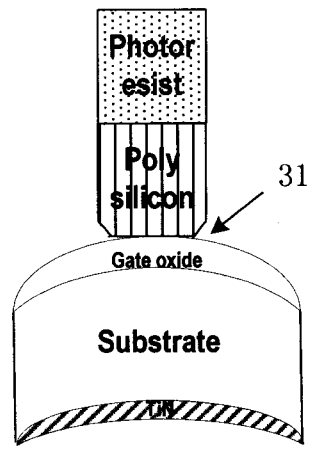
Figure 3E:
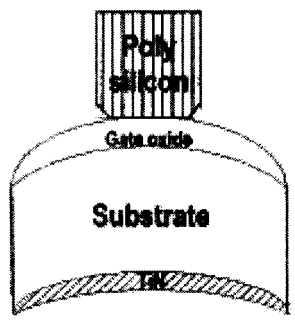
Figure 3F:
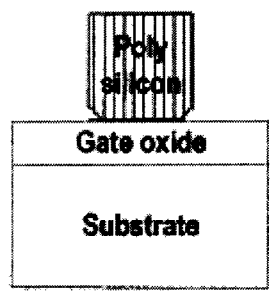

FIG. 3A-3F schematically illustrate sectional views of a semiconductor device of respective steps in the method of manufacturing semiconductor device in accordance with the second embodiment of the present invention; FIG. 3A illustrates a sectional view after forming a gate oxide layer and a polysilicon layer in succession on the first surface of the substrate; FIG. 3B illustrates a sectional view after depositing a TiN layer on the second surface of the substrate; FIG. 3C illustrates a sectional view after forming a photoresist pattern on the polysilicon layer; FIG. 3D illustrates a sectional view after forming a polysilicon gate with reentrants 31 through etching the polysilicon layer using patterned photoresist as a mask; FIG. 3E illustrates a sectional view after removing the remained photoresist; FIG. 3F illustrates a sectional view after removing the TiN layer.

It should be noted that the TiN layer in the embodiments as shown in FIG. 2 and FIG. 3 can be deposited after forming the photoresist layer or forming the patterned photoresist, and before etching the polysilicon layer, even before forming the polysilicon layer; the sequence of the steps of removing the photoresist and the TiN layer can be exchanged; or the step of removing the TiN layer can be omitted. Other types of the tensile stress film can be used to replace the TiN layer in above embodiments according to requirements.

In the above embodiments, the tensile stress film can be deposited on different occasions, so as to produce more choices and flexibility.

Figure 4:
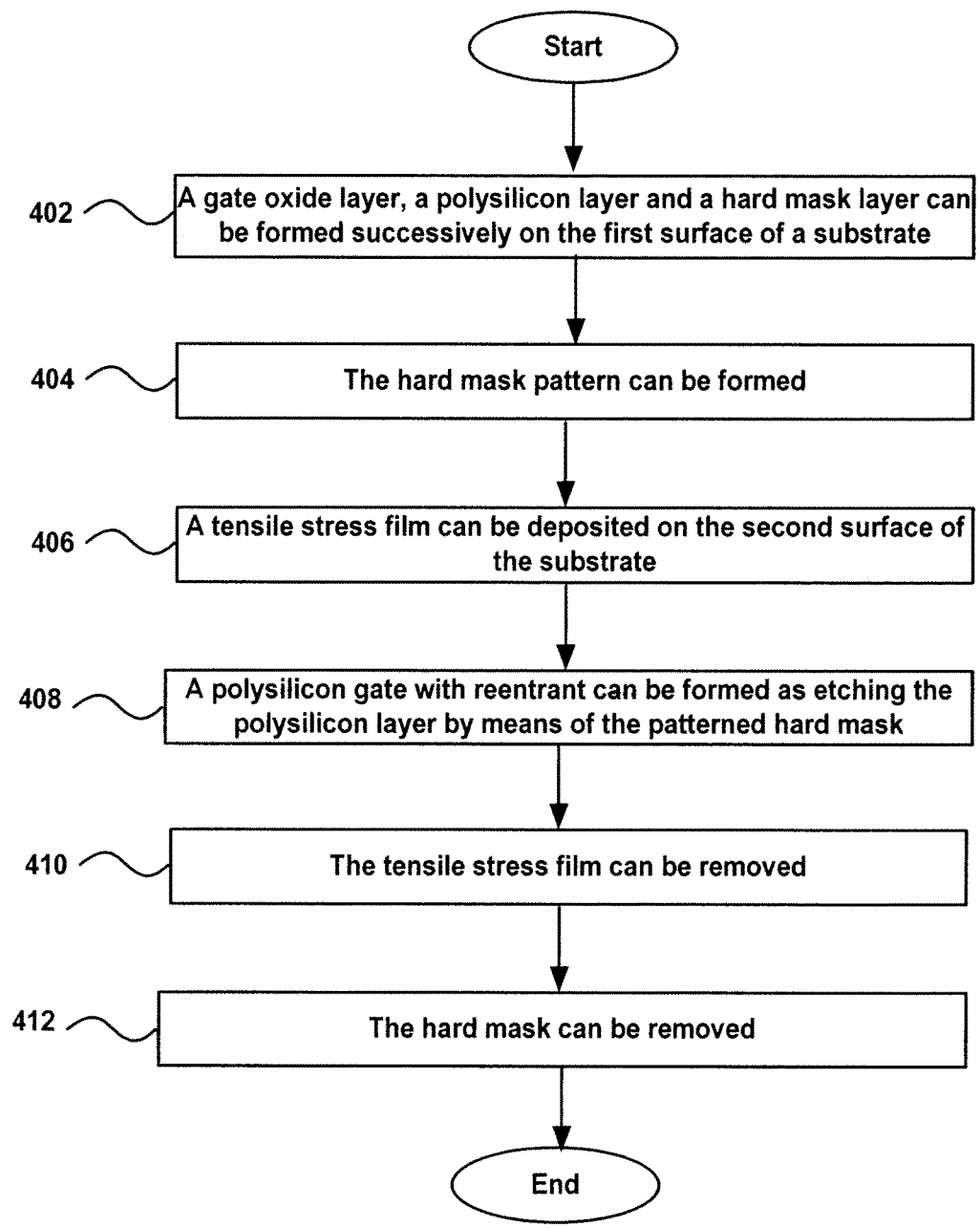
FIG. 4 is a flowchart showing a method of manufacturing semiconductor device in accordance with a third embodiment of the present invention.

FIG. 4 is a flowchart showing a method of manufacturing a semiconductor device in accordance with a third embodiment of the present invention. In the embodiment, the polysilicon layer can be etched through a patterned hard mask.

As shown in FIG. 4, at step 402, a gate oxide layer, a polysilicon layer and a hard mask layer can be formed successively on the first surface of a substrate.

At step 404, the hard mask pattern can be formed. For example, the photoresist layer can be formed on the hard mask layer. The photoresist layer can be photoetched to form a patterned photoresist which can be used as a mask for etching the hard mask in order to form a hard mask pattern; non-photoetching methods can also be used to form the hard mask pattern.

At step 406, a tensile stress film can be deposited on the second surface of the substrate. After depositing the tensile stress film, the tensile stress can be applied on the wafer.

At step 408, a polysilicon gate with reentrants can be formed by etching the polysilicon layer by use of the patterned hard mask. Under the tensile stress generated by the tensile stress film, the polysilicon gate with reentrants can be formed by etching the polysilicon layer.

At step 410, the tensile stress film can be removed.

At step 412, the hard mask can be removed.

Figure 5A:
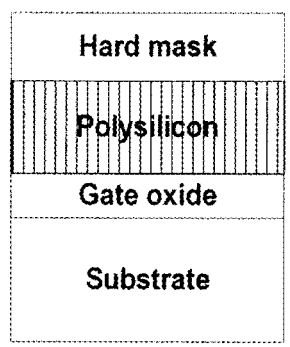
FIG. 5A-5F schematically illustrate sectional views of a semiconductor device of respective steps in the method of manufacturing semiconductor device in accordance with the third embodiment of the present invention.
Figure 5B:
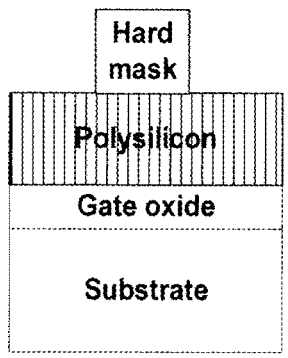
Figure 5C:
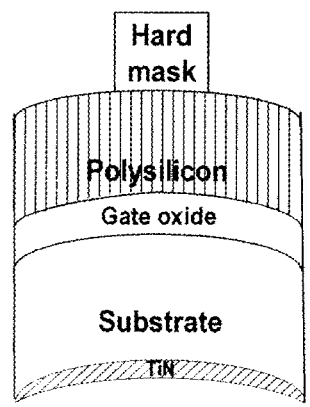
Figure 5D:
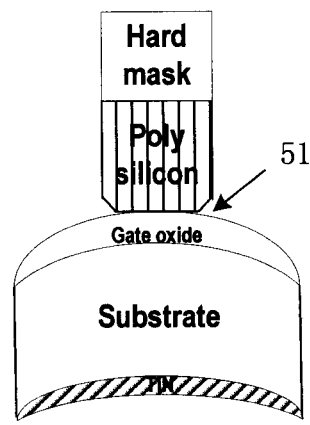
Figure 5E:
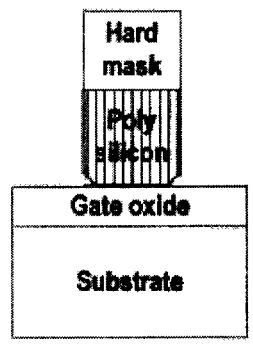
Figure 5F:
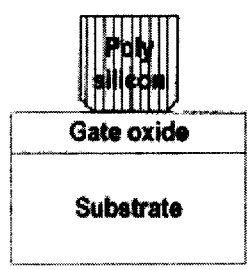

FIG. 5A-5F schematically illustrate sectional views of a semiconductor device of respective steps in the method of manufacturing semiconductor device in accordance with the third embodiment of the present invention; FIG. 5A illustrates a sectional view after forming a gate oxide layer, a polysilicon layer and a hard mask in succession on a first surface of a substrate; FIG. 5B illustrates a sectional view after forming a hard mask pattern; FIG. 5C illustrates a sectional view after depositing a TiN layer on a second surface of the substrate; FIG. 5D illustrates a sectional view after forming a polysilicon gate with reentrants 51 through etching the polysilicon layer by use of the patterned hard mask; FIG. 5E illustrates a sectional view after removing the TiN layer; FIG. 5F illustrates a sectional view after removing the remained hard mask.

In the embodiments of FIG. 4 and FIG. 5, the tensile stress film is deposited after forming the hard mask pattern, and the tensile stress film can be removed as soon as possible after etching the polysilicon layer. Therefore, it can be avoided that the tensile stress film affects other steps in the manufacturing process. And the pollution caused by the tensile stress film can be avoided.

It should be noted that the TiN layer in the embodiments as shown in FIG. 4 and FIG. 5 can be deposited before forming the patterned hard mask, even before forming the polysilicon layer; the sequence of the steps of removing the hard mask and removing the TiN layer can be exchanged; or the step of removing the TiN layer can be omitted. Other types of the tensile stress film can be used to replace the TiN layer in above embodiments according to requirements.

It should be understood by a person skilled in the art that there can be a buffer layer included between the polysilicon layer and the hard mask layer in the embodiments as shown in FIGS. 4 and 5.

The stress on the front surface of the substrate caused by the tensile stress film which can be deposited on the back surface of the substrate is related with the thickness of the tensile stress film. Calculated strain from CBED (convergent beam electron-diffraction) analysis shows that thinner TiN layer induces more tensile stress in the substrate (see: Chang Yong Kang, IEEE ELECTRON DEVICE LETTERS, VOL. 29, NO. 5, MAY 2008). FIG. 6 is a graph showing the corresponding relation between the thickness of a TiN pad and stress. As shown in FIG. 6, in a certain scope, a thinner film can generate bigger stress at the same thickness on the front surface of the substrate. According to one embodiment of the present invention, the stress can be controlled by modifying the thickness of the tensile stress film, which can further control the size of the reentrants. In the embodiment, the size of the reentrants can be controlled by modifying the thickness of the tensile stress film, which can further control the performance of semiconductor devices.

In accordance with one embodiment of the present invention, a wafer for manufacturing semiconductor device is provided. A tensile stress film deposited on one surface of the wafer can generate tensile stress for the wafer. The tensile stress film can be a Nitride film with the tensile stress, for example, a titanium nitride (TiN) film, a phosphorus nitride film, a aluminum nitride film etc. Wafers with the tensile stress film can be provided for professional and mass production so as to improve the quality of semiconductor devices, and also avoid affecting other processes or causing pollution.

In accordance with one embodiment of the present invention, the wafer successively includes: a substrate, a gate oxide layer, a polysilicon layer; a photoresist layer can also be included on the polysilicon layer. In accordance with another embodiment of the present invention, the wafer successively includes a substrate, a polysilicon layer and a hard mask layer; a buffer layer can be included between the polysilicon layer and the hard mask layer; a photoresist layer can also be included on the hard mask layer. Wafers with different layers can be used by users according to users' requirements, which provide more choices and flexibility for users.

Figure 7A:
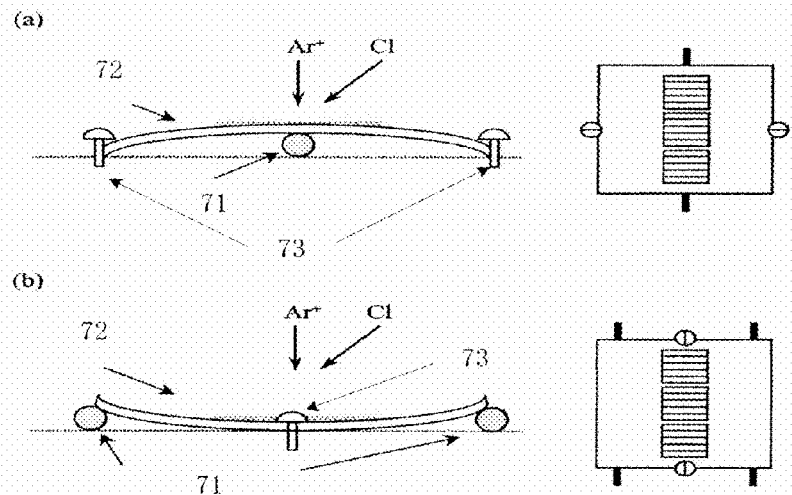
FIG. 7A-7B is a diagram showing effects on the shape of a polysilicon gate caused by different stresses applied on the substrate by a screw and a tungsten wire.
Figure 7B:
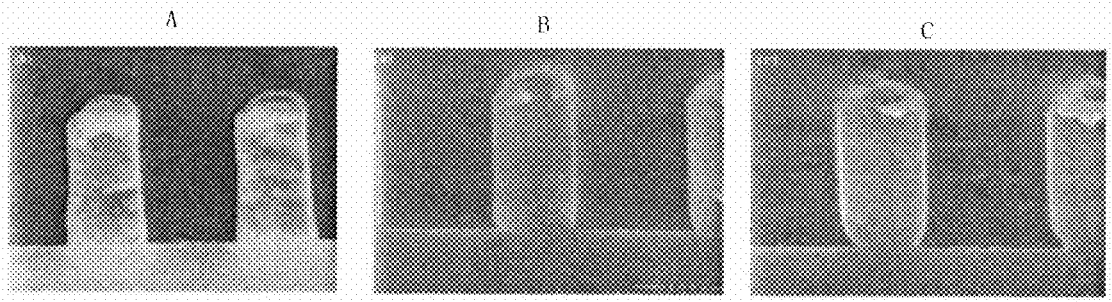
Figure 8:
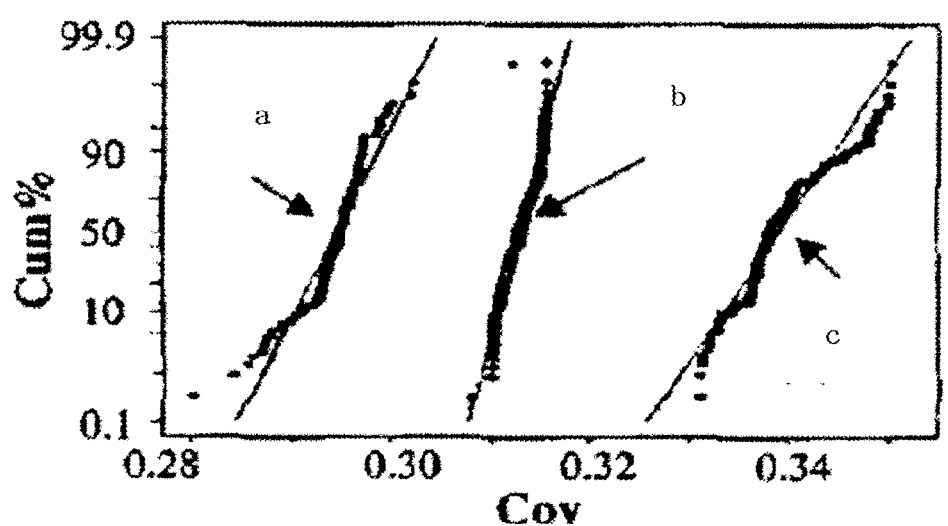
FIG. 8 is a graph showing the variation in NMOST gate source/drain overlap capacitance as a function of the shape of a polysilicon gate.
Figure 9A:
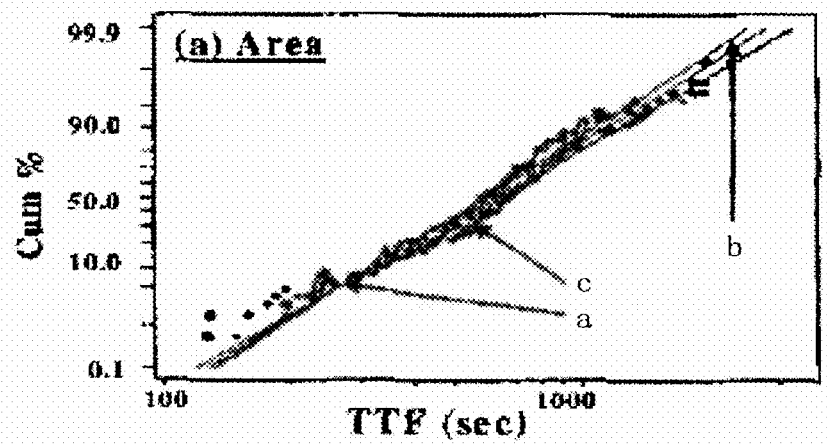
FIG. 9A is a graph showing the variation in NMOST TDDB of area structure as a function of the shape of a polysilicon gate.
Figure 9B:
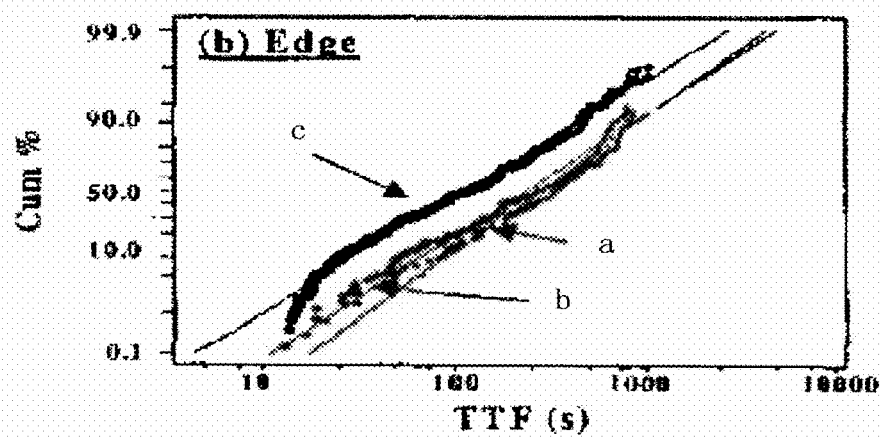
FIG. 9B is a graph showing the variation in NMOST TDDB of edge structure as a function of the shape of a polysilicon gate.

FIG. 7A-7B is a diagram showing effects on the shape of a polysilicon gate caused by different stresses applied on the substrate by a screw and a tungsten wire (see: Jane P. Chang, et al, J. Vac. Sci. Technol. B 19 (5), September/October 2001). FIG. 7A illustrates situations of applying a compressive stress (a) and a tensile stress (b) respectively by a screw 73 and a tungsten wire 71. The label 71 indicates the tungsten wire, the label 72 indicates a patterned poly sample, and the label 73 indicates the screw. FIG. 7B illustrates the shapes of the polysilicon gates. The diagram A of FIG. 7B illustrates the polysilicon gate formed by imposing the compressive stress, from which the polysilicon gate with foot can be observed; the diagram B of FIG. 7B illustrates the polysilicon gate formed without an imposed stress, from which the bottom of the polysilicon gate with straight wall can be observed; the diagram C of FIG. 7B illustrates the polysilicon gate formed by imposing the tensile stress, from which the polysilicon gate with reentrants can be observed. In accordance with embodiments of the present invention, the polysilicon gate with reentrants on its bottom can be formed by depositing the tensile stress film on the back surface of the substrate.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method of manufacturing a semiconductor device, said method comprising:
   providing a substrate, on a first surface of which a gate oxide layer, a polysilicon layer and a mask layer are formed, and a buffer layer being included between said polysilicon layer and said mask layer;
   etching said polysilicon layer by use of a patterned mask so as to form a polysilicon gate with reentrants;
   wherein said method further comprises:
   depositing a tensile stress film on a second surface of said substrate before etching said polysilicon layer and before forming said mask layer on said first surface of said substrate; or depositing said tensile stress film on said second surface of said substrate, after patterning said mask layer and before etching said polysilicon layer with the patterned mask layer; and
   wherein said method further comprises: removing said tensile stress film after forming said polysilicon gate.

2. The method of claim 1, wherein said tensile stress film is a nitride film with a tensile stress.

3. The method of claim 1, wherein said tensile stress film is a titanium nitride film, a phosphorus nitride film, or an aluminium nitride film.

4. The method of claim 1, wherein said tensile stress film has a thickness of 2-50 nm.

5. The method of claim 1, wherein said mask layer is a hard mask layer.

6. The method of claim 1, wherein said mask layer is a photoresist layer;
   depositing said tensile stress film on said second surface of said substrate, after patterning said mask layer and before etching said polysilicon layer with the patterned mask layer comprising:
   depositing said tensile stress film on said second surface of said substrate, after patterning said photoresist layer by means of photolithography to form a patterned photoresist layer and before etching said polysilicon layer masked by the patterned photoresist layer.

7. The method of claim 1, wherein said etching is a dry etching or a plasma etching.

8. The method of claim 1, wherein said tensile stress film is a nitride film with a tensile stress, said tensile stress film has a thickness of 2-50 nm.

9. The method of claim 8, wherein said nitride film with a tensile stress is a titanium nitride film;
   the step of depositing a tensile stress film on a second surface of said substrate including:
   at room temperature or a temperature higher than room temperature, the target Ti being sputtered by plasma, and nitrogen being brought into a chamber for depositing TiN.

10. The method of claim 8, wherein said nitride film with a tensile stress is a phosphorus nitride film, or an aluminium nitride film.

* * * * *